(12) United States Patent
Alpert et al.

(10) Patent No.: US 7,392,493 B2
(45) Date of Patent: Jun. 24, 2008

(54) TECHNIQUES FOR SUPER FAST BUFFER INSERTION

(75) Inventors: Charles Jay Alpert, Round Rock, TX (US); Zhuo Li, College Station, TX (US); Stephen Thomas Quay, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 326 days.

(21) Appl. No.: 10/996,292

(22) Filed: Nov. 22, 2004

(65) Prior Publication Data

US 2006/0112364 A1    May 25, 2006

(51) Int. Cl.
*G06F 17/50* (2006.01)
(52) U.S. Cl. .............................. 716/6; 716/10
(58) Field of Classification Search ....................... None
See application file for complete search history.

(56) References Cited

U.S. PATENT DOCUMENTS

| | | | | |
|---|---|---|---|---|
| 6,253,356 | B1* | 6/2001 | Kung | 716/5 |
| 6,347,393 | B1* | 2/2002 | Alpert et al. | 716/2 |
| 6,493,854 | B1* | 12/2002 | Chowdhury et al. | 716/6 |
| 6,591,411 | B2* | 7/2003 | Alpert et al. | 716/13 |
| 6,915,496 | B2* | 7/2005 | Alpert et al. | 716/5 |
| 7,062,743 | B2* | 6/2006 | Kahng et al. | 716/13 |
| 7,127,696 | B2* | 10/2006 | Alpert et al. | 716/10 |

OTHER PUBLICATIONS

Lillis et al., "Optimal Wire Sizing and Buffer Insertion for Low Power and a Generalized Delay Model," IEEE Journal of Solid-State Circuits, vol. 31, No. 3, Mar. 1996, pp. 437-447.* van Ginneken, "Buffer Placement in Distributed RC-tree Networks for Minimal Elmore Delay," 1990 IEEE, ISCAS Proceedings, pp. 865-868.*

Menezes et al., "Spec-based Repeater Insertion and Wire Sizing for On-chip Interconnect," 12th Int'l Conference on VLSI Design, 1999, pp. 476-482.*

Alpert et al., "Minimum Buffered Routing With Bounded Capacitive Load for Slew Rate and Reliability Control," IEEE Transactions on CAD of ICs and Systems, vol. 22, No. 3, Mar. 2003, pp. 241-253.*

Tellez et al., "Minimal Buffer Insertion in Clock Trees with Skew and Slew Rate Constraints," IEEE Transactions on CAD and Systems, vol. 16, No. 4, Apr. 1997, pp. 333-342.*

* cited by examiner

*Primary Examiner*—Leigh M. Garbowski
(74) *Attorney, Agent, or Firm*—Casimer K. Salys; Jack V. Musgrove

(57) ABSTRACT

A method of determining buffer insertion locations in an integrated circuit design establishes candidate locations for inserting buffers into a net, and selects buffer insertion locations from among the candidates based on slew constraints. The selection of buffer insertion locations preferably optimizes slack and buffer cost while keeping slew from any buffered node to any sink less than a required slew rate. The slew analysis computes an output slew $SL(v)$ of a given buffer $b$ inserted at a node $v$ as $SL(v)=RS(b) \cdot C(v)+KS(b)$, where $C(v)$ is the downstream capacitance at $v$, $RS(b)$ is the slew resistance of buffer $b$, and $KS(b)$ is the intrinsic slew of buffer $b$. The delay through a given buffer may also be computed based on signal polarity. However, the invention still preferably uses worst-case slew resistance and intrinsic slew in considering the slew constraints. If the selection of the buffer insertion locations results in no locations being selected due to slew violations, the present invention may advantageously find a partial solution by relaxing the slew constraint.

12 Claims, 4 Drawing Sheets

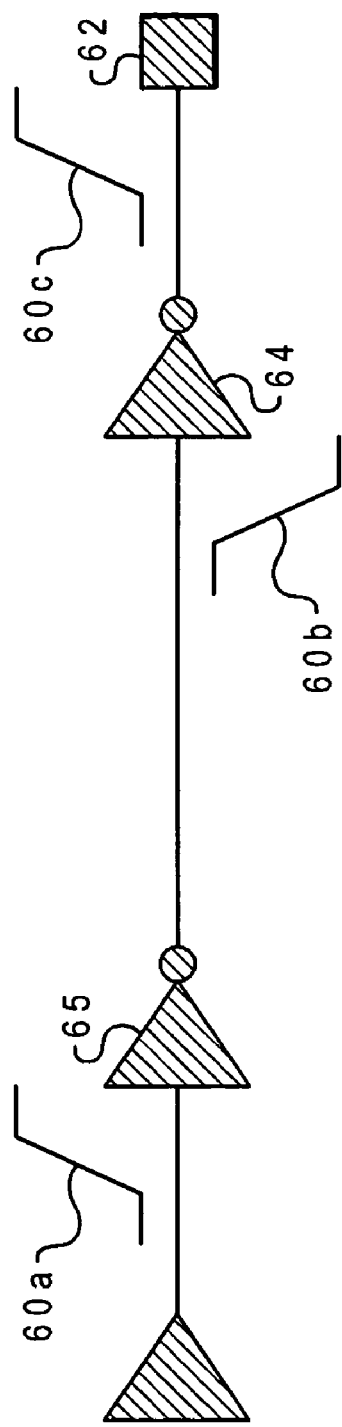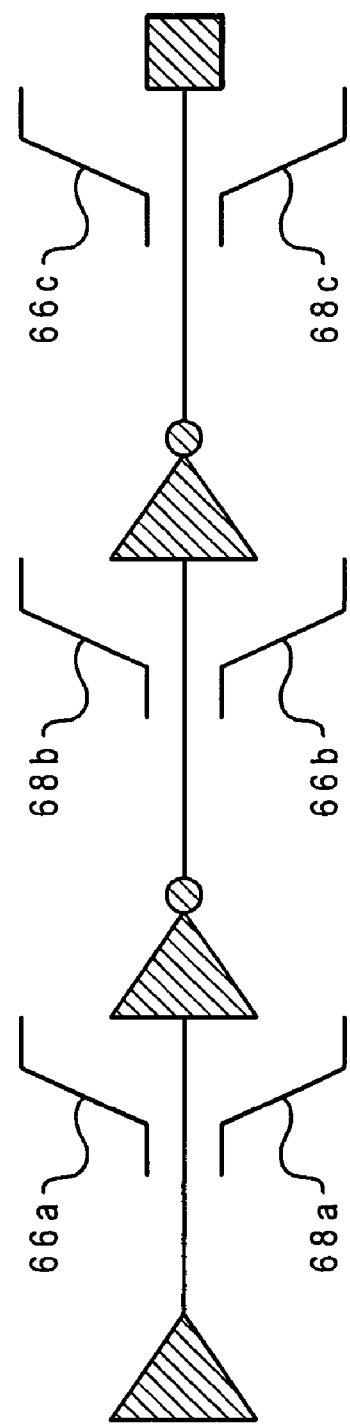
*Fig. 3A*
*Fig. 3B*

TECHNIQUES FOR SUPER FAST BUFFER INSERTION

CROSS-REFERENCE TO RELATED APPLICATION

The present application is related to U.S. patent application Ser. No. 10/306,603 filed Nov. 26, 2002, and U.S. patent application Ser. No. 10/738,714 filed Dec. 17, 2003, each of which is hereby incorporated.

BACKGROUND OF THE INVENTION

1. Field of the Invention

The present invention generally relates to the fabrication and design of semiconductor chips and integrated circuits, more specifically to a method of performing buffer insertion to manage timing and electrical requirements in an integrated circuit design.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The component formation requires very exacting details about geometric patterns and separation between them. The process of converting the specifications of an electrical circuit into a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML.

Faster performance and predictability of responses are elements of interest in circuit designs. As process technology scales to the submicron regime, interconnect delays increasingly dominate gate delays. Consequently, physical design optimization tools such as floorplanning, placement, and routing are becoming more "timing-driven" than the previous generation of tools. For such a tool to be effective, it must be able to efficiently compute interconnect delay since several million delay calculations are required to optimize a design. In certain types of circuits, delays exist based on circuit topology and circuit components. Delays are particularly acute in circuits having resistive and capacitive elements, or RC circuits. Circuit designers continually search for efficient techniques for accurate estimation of these delays, while determining the particular circuit's response to a load. In particular, circuit designers want to be able to calculate reliable delay information when designing the circuit. To this end, several prior art metrics (i.e., computational methods) have been developed.

The Elmore delay metric, which calculates the first moment of the impulse response, is the most widely applied and simplest interconnect delay metric that still captures some amount of metal resistance effects. The Elmore metric provides an upper bound on delay given any input waveform because the RC circuit impulse response is unimodal and positively skewed. The Elmore delay metric is commonly utilized for performance optimization tasks such as floorplanning, placement, buffer insertion, wire sizing in part and global routing. The widespread use of the Elmore delay metric is due to its closed form expression, fast computation speed, and fidelity with respect to simulation. Closed form delay equations, such as Elmore delay metric, are generally preferable due to both efficiency and ease of implementation, as long as they are sufficiently accurate.

Owing to the tremendous drop in VLSI feature size, a huge number of buffers (i.e., amplifiers or inverters) are needed for achieving timing objectives and fixing electrical violations for interconnects. It is estimated that the number of buffers will rise dramatically, reaching about 15% of the total cell count for intrablock communications for 65 nanometer technology, and close to 800,000 buffers required for 50 nanometer technologies. Therefore, both the complexity and importance of buffer insertion is increasing in an even faster pace.

Physical synthesis is prominent in the automated design of integrated circuits such as high performance processors and application specific integrated circuits (ASICs). Physical synthesis is the process of concurrently optimizing placement, timing, power consumption, crosstalk effects and the like in an integrated circuit design. This comprehensive approach helps to eliminate iterations between circuit analysis and place-and-route. Physical synthesis has the ability to repower gates, insert buffers, clone gates, etc., so the area of logic in the design remains fluid. However, physical synthesis can take days to complete.

During physical synthesis, buffer insertion is called for to either optimize nets for delay or to fix nets due to electrical violations. One mechanism for performing buffer insertion on a fixed Steiner integrated circuit topology is the van Ginneken algorithm, as described in "Buffer Placement in Distributed RC-tree Networks for Minimal Elmore Delay," ISCAS Proceedings pp. 865-868 (1990). Given a fixed Steiner tree topology, the van Ginneken algorithm finds the optimal buffer placement on the topology under an Elmore delay model for a single buffer type and simple gate delay model. The primary idea of van Ginneken is to choose a set of buffer candidate locations that lie on the Steiner topology at some uniformly fixed distance apart. Buffer insertion then proceeds for that particular set of candidates from sink to source. When a candidate location falls within a region that is blocked because it is too densely populated with logic, that location is skipped and a buffer is inserted into the next candidate insertion location that is not blocked while maintaining the uniform spacing.

As seen in FIG. 1, a Steiner tree representation of a net 1 places candidate buffer insertion points 2 at regular intervals along the paths from source 3 to sinks 4, 5 and 6. A logic cell 7 (or a portion of a logic cell) is present in the path of the net. The portion of the net block by logic cell 7 is skipped when determining candidate buffer insertion points 2. The spacing between candidate insertion points may be increased or decreased by the designer to achieve a particular timing requirement. Increasing the frequency of buffer insertion locations can improve timing of the net, but at an increased buffer cost.

One problem with the van Ginneken approach is that buffer insertion fails to take into consideration more realistic net parameters, such as input signal polarities and slew constraints. From extensive experiments of traditional buffer insertion algorithms on typical industrial circuits with 300,000 or more objects, there is a big difference between the slack improvement computed by buffer insertion and the slack improvement computed by a static timing analysis tool. Traditional buffer insertion does not consider these differences and may result in suboptimal results. Van Ginneken's algorithm also restricts buffer placement to uniform locations along a net, which fails to take advantage of the density of the logic in the vicinity of the candidate locations.

In light of the foregoing, it would be desirable to devise an improved method of selecting buffer insertion locations to efficiently achieve timing closure. It would be further advantageous if the method could allow for buffer insertion with non-uniform spacings to take advantage of variations in the density of the logic regions.

SUMMARY OF THE INVENTION

It is therefore one object of the present invention to provide an improved method of selecting buffer insertion locations in a net of an integrated circuit design.

It is another object of the present invention to provide such a method which is relatively fast but still takes into consideration practical timing constraints.

It is yet another object of the present invention to provide an interconnect optimization process that uses buffer insertion to achieve better quality timing solutions while maintaining superior computation speed.

The foregoing objects are achieved in a method of determining buffer insertion locations in an integrated circuit design, by defining at least one slew constraint for the net, establishing a plurality of candidate locations for inserting one or more buffers into the net, and selecting buffer insertion locations from among the candidate locations based on the slew constraint. The selection of buffer insertion locations preferably optimizes slack and buffer cost while keeping slew from any buffered node to any sink less than a required slew rate. In the illustrative implementation, the slew analysis includes computing an output slew SL(v) of a given buffer b inserted at a node v as $$SL(v) = RS(b) \cdot C(v) + KS(b),$$

where C(v) is the downstream capacitance at v, RS(b) is the slew resistance of buffer b, and KS(b) is the intrinsic slew of buffer b. In addition to consideration of slew constraints, the delay through a given buffer may be computed based on input signal polarity and the polarity of a corresponding candidate location. However, the invention still preferably uses worst-case slew resistance and intrinsic slew in considering the slew constraint. If the selection of the buffer insertion locations results in no locations being selected due to slew violations, the present invention may advantageously find a partial solution by relaxing the slew constraint.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

FIGS. 3A and 3B are schematic diagrams illustrating buffer insertion spacings and input signal polarities which are analyzed in accordance with one implementation of the present invention.

The use of the same reference symbols in different drawings indicates similar or identical items.

DESCRIPTION OF THE PREFERRED EMBODIMENT(S)

Figure 1:
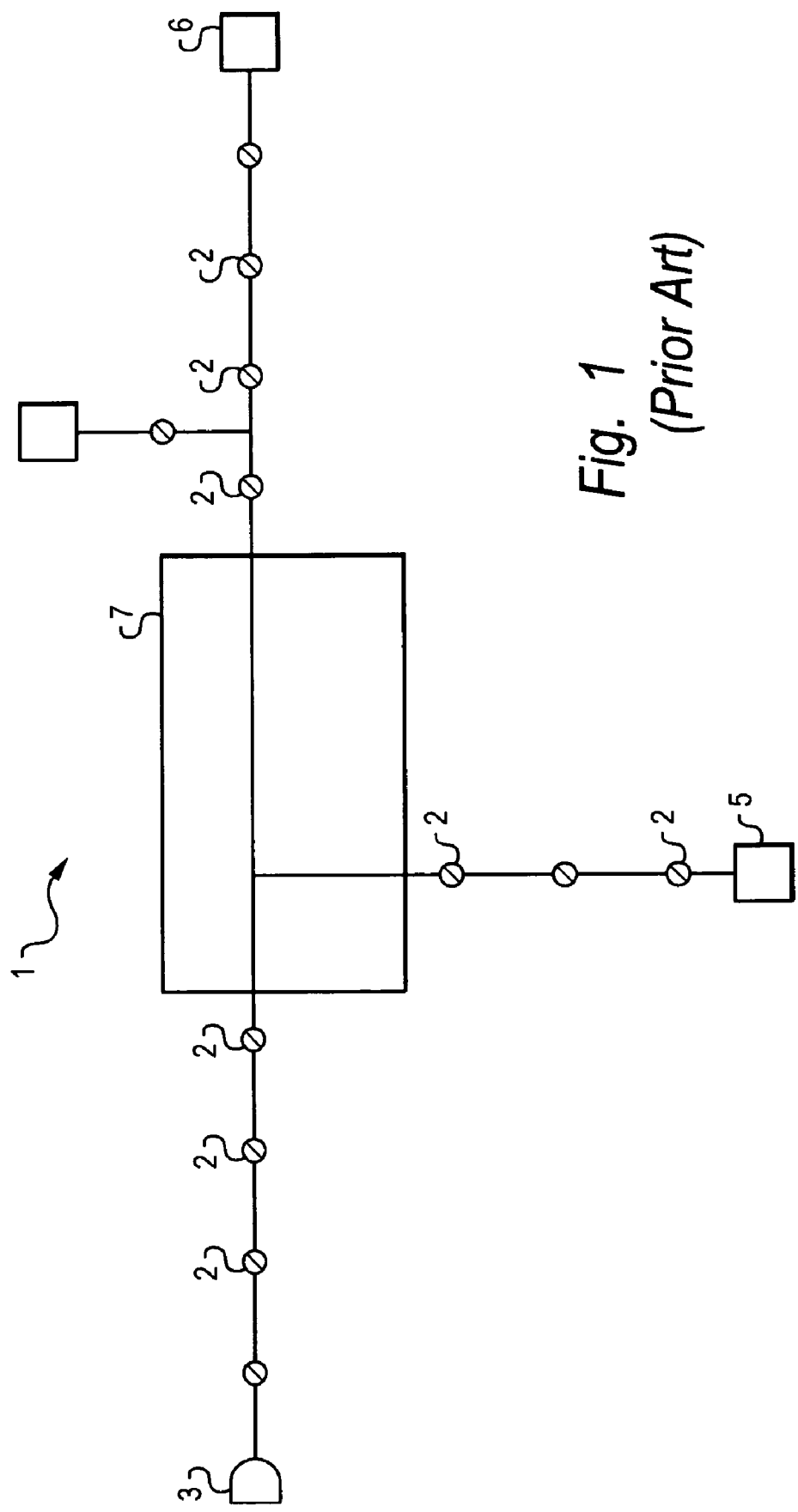
FIG. 1 is a diagram of a Steiner tree for a net of an integrated circuit design showing candidate buffer insertion points at regular intervals along the paths from a source to several sinks, according to the prior art van Ginneken algorithm.
Figure 2:
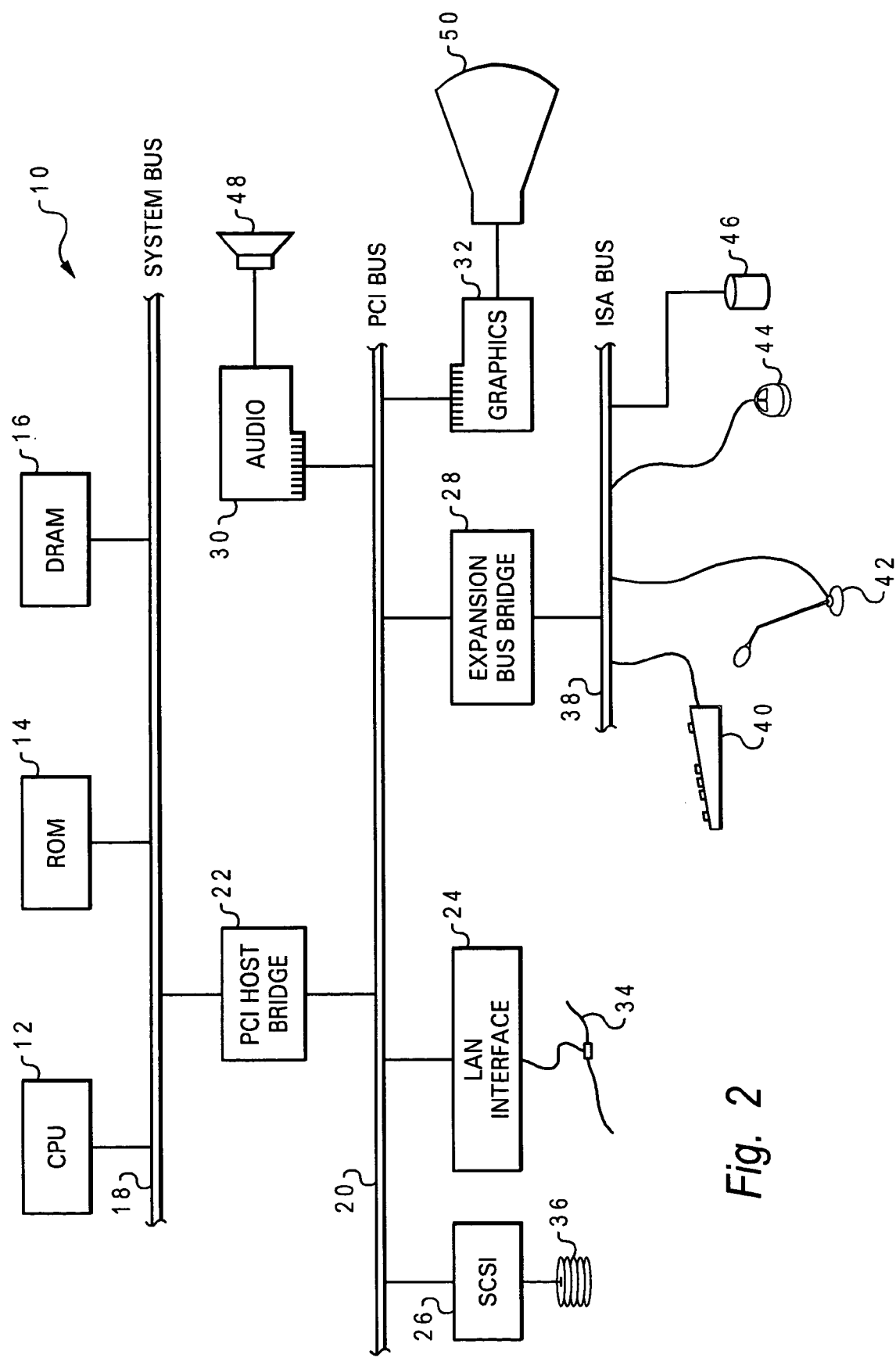
FIG. 2 is a block diagram of a computer system programmed to carry out computer-aided design of an integrated circuit in accordance with one implementation of the present invention.

With reference now to the figures, and in particular with reference to FIG. 2, there is depicted one embodiment 10 of a computer system programmed to carry out computer-aided design of an integrated circuit in accordance with one implementation of the present invention. System 10 includes a central processing unit (CPU) 12 which carries out program instructions, firmware or read-only memory (ROM) 14 which stores the system's basic input/output logic, and a dynamic random access memory (DRAM) 16 which temporarily stores program instructions and operand data used by CPU 12. CPU 12, ROM 14 and DRAM 16 are all connected to a system bus 18. There may be additional structures in the memory hierarchy which are not depicted, such as on-board (L1) and second-level (L2) caches. In high performance implementations, system 10 may include multiple CPUs and a distributed system memory.

CPU 12, ROM 14 and DRAM 16 are also coupled to a peripheral component interconnect (PCI) local bus 20 using a PCI host bridge 22. PCI host bridge 22 provides a low latency path through which processor 12 may access PCI devices mapped anywhere within bus memory or I/O address spaces.

PCI host bridge 22 also provides a high bandwidth path to allow the PCI devices to access DRAM 16. Attached to PCI local bus 20 are a local area network (LAN) adapter 24, a small computer system interface (SCSI) adapter 26, an expansion bus bridge 28, an audio adapter 30, and a graphics adapter 32. LAN adapter 24 may be used to connect computer system 10 to an external computer network 34, such as the Internet. A small computer system interface (SCSI) adapter 26 is used to control high-speed SCSI disk drive 36. Disk drive 36 stores the program instructions and data in a more permanent state, including the program which embodies the present invention as explained further below. Expansion bus bridge 28 is used to couple an industry standard architecture (ISA) expansion bus 38 to PCI local bus 20. As shown, several user input devices are connected to ISA bus 38, including a keyboard 40, a microphone 42, and a graphical pointing device (mouse) 44. Other devices may also be attached to ISA bus 38, such as a CD-ROM drive 46. Audio adapter 30 controls audio output to a speaker 48, and graphics adapter 32 controls visual output to a display monitor 50, to allow the user to carry out the integrated circuit design as taught herein.

While the illustrative implementation provides the program instructions embodying the present invention on disk drive 36, those skilled in the art will appreciate that the invention can be embodied in a program product utilizing other computer-readable media, including transmission media.

Computer system 10 carries out program instructions for an interconnect optimization process that uses novel buffer insertion techniques to manage timing requirements and electrical violations. Accordingly, a program embodying the invention may include conventional aspects of various placement and timing tools, and these details will become apparent to those skilled in the art upon reference to this disclosure.

The present invention provides an improved method of determining buffer insertion locations which takes into consideration realistic timing parameters. In one embodiment, computer system 10 uses an algorithm which relies on the van Ginneken approach, but further includes consideration of slew constraints and input signal polarity. In the van Ginneken method, a net is given as a routing tree $T=(V, E)$, where $V=\{s_0\} \cup V_s \cup V_n$, $E \subset V \times V$, vertex $s_0$ is the source vertex and also the root of T, $V_s$ is the set of sink vertices, and $V_n$ is the set of internal vertices. Each sink vertex $s \in V_s$ is associated with sink capacitance $C(s)$, required arrival time $RAT(s)$, required slew rate $SC(s)$ and polarity $p(s)$, where $p(s)=0/1$ indicates same/opposite polarity with the source. A target required arrival time for source $RAT(s_0)$ is also given. The input polarity of the source is indicated by $p(s_0)$, where $p(s_0)=0/1$ indicates the input signal is a rising/falling signal. Each node $v \neq s_0$ has a unique parent wire $(u, v) \in E$. The tree is assumed to be binary, i.e., each node can have at most two children. The left and right children of v are denoted by T.left(v) and T.right(v), respectively. If v has only one child, then it is T.left(v). A buffer library B contains different types of buffers. For each buffer type $b \in B$, the intrinsic delay is $K(b)$, driving resistance is $R(b)$, input capacitance is $C(b)$, polarity is $p(b)$ where 0/1 means buffer/inverter, and the required input slew rate is $SC(b)$. A function $f: V_n \to 2^B$ specifies the types of buffers allowed at each internal vertex. Each buffer type $b_i$ also has a buffer cost $W(b_i)$. Each edge e is associated with a lumped resistance $R(e)$ and wire capacitance $C(e)$.

In the exemplary implementation, the Elmore delay is used for the interconnect and the linear delay is used for buffers. For each edge $e=(v_i, v_j)$, signals travel from $v_i$ to $v_j$. The Elmore delay of e is $D(e)=R(e)(C(e)/2+C(v_j))$, where $C(v_j)$ is the downstream capacitance at $v_j$. For any buffer b at vertex v, the buffer delay is $D(v)=R(b)\cdot C(v)+K(b)$, where $C(v)$ is the downstream capacitance at v. When a buffer b is inserted, the capacitance viewed from upper stream is $C(b)$.

A generalized solution to the buffer insertion problem is a mapping $M: V_n \to B \cup b^\sim$ which either assigns a buffer or no buffer, denoted by b, to each internal node of T. An absolute value of the mapping $|M|=|\{v \in IN: M(v) \in B\}|$ denotes the number of buffers inserted by M. Assigning k buffers to T induces k+1 nets and k+1 subtrees, each with no internally placed buffers. For any vertex $v \in V$, $T(v)$ is denoted as the subtree downstream from v (with v being the root). For a candidate $\alpha$ of $T(v)$ (i.e., buffer insertion location), the subtree rooted at v is denoted as $T_\alpha(v) = (\{v\} \cup V_{s,T\alpha}(v) \cup V_{n,T\alpha}(v), E_{T(v)})$, and is the maximal subtree of $T(v)$ such that v is the source and $T_\alpha(v)$ contains no internal buffers. $V_{s,T\alpha}(v)$ is the set of sink vertices of $T_\alpha(v)$, where $V_{s,T\alpha}(v)=\{v|v \in V_s \cap T_\alpha(v)\} \cup \{v|v \in V_n \cap T_\alpha(v), M(v) \in B\}$. $V_{n,T\alpha}(v)$ is the set of internal nodes of $T(v)$, where $V_{n,T\alpha}(v)=\{v|v \in V_n \cap T_\alpha(v), M(v)=b^\sim\}$. If $v \in V_s$, then $T_\alpha(v)=(\{v\}, \emptyset)$.

The path $p(u, v)$ from node u to v is an ordered subset of wires $(u, u_1), (u_1, u_2), \ldots, (u_n, v)$ of E. A wire path $wp(u, v)$ from u to v is a path $p(u, v)$ such that there are no buffers assigned to nodes $u_1, u_2, \ldots, u_n$, but u and v are both gates. The wire delay of $wp(u, v)$ is $$D(wp(u,v))=\Sigma_{e=(w,v)}D(e),$$

where the sum is over all edges in $wp(u, v)$. The delay from node v to sink $s_i \in T(v)$ under $\alpha$ is $$D(v,s_i,\alpha)=\Sigma_{wp(v,v1) \in p(v,si)}(D(v)+D(wp(v,v_1))),$$

where $D(v)$ is the buffer delay. The slack of v under $\alpha$ is $$Q(v,\alpha)=\min_{s \in T(v)}\{RAT(s)-D(v,s,\alpha)\}.$$

The buffer cost of $\alpha$ is the total cost of buffers used in $\alpha$:

$$W(v,\alpha)=\Sigma_{bi \in \alpha}W(b_i).$$

The buffer insertion problem can be defined as follows. Given a routing tree T, sink capacitance $C(s)$ and required arrival time $RAT(s)$ for each sink s, capacitance $C(e)$ and resistance $R(e)$ for each edge e, buffer library B, possible buffer position f; and buffer cost function W, find a candidate $\alpha$ for T that maximizes $Q(s_0, \alpha) \geq RAT(s_0)$ and the total buffer cost $W(s_0, \alpha)$ is minimum. The effect of a candidate to the upstream is described as a 3-tuple (Q, C, W). The value Q represents the required arrival time (initially in the algorithm the slack is set equal to the RAT); C is the downstream load capacitance; and W is the total cost. If W is the number of buffers, then $W=|M|$. For any two candidates $\alpha_1$ and $\alpha_2$ of $T(v)$, we say $\alpha_1$ dominates $\alpha_2$ if $Q(v,\alpha_1) \geq Q(v,\alpha_2)$, $C(v,\alpha_1) \leq C(v,\alpha_2)$ and $W(v,\alpha_1) \leq W(v,\alpha_2)$. The set of nonredundant candidates of $T(v)$, denoted as $N(v)$, is the set of candidates such that no candidate in $N(v)$ dominates any other candidate in $N(v)$, and every candidate of $T(v)$ is dominated by some candidates in $N(v)$.

The basic van Ginneken algorithm proceeds in bottom-up fashion starting at sinks and ending at the source. Candidate solutions are established at each node in the tree and candidates propagate up the tree, while also generating new candidates. The algorithm repeats recursively until the source is encountered, at which point the driver delay is added to each candidate, and the best solution is chosen. The number of buffers can be considered as the cost function, but the algorithm can use any general cost function. The present invention uses a similar strategy, but adds consideration of other timing parameters such as slew constraints or input signal polarities.

In the exemplary implementation, the invention uses the algorithm Find_Cands(v) to find a list of candidate solutions S for the input node v (two subsets $S^+$ and $S^-$ are processed separately to handle inverters):

```
 1: S⁺ = S⁻ = S_b⁺ = S_b⁻ = ∅
 2: If v ∈ V_s and p(v) = 0
 3:     S⁺ = {(RAT(v), C(v), b~}
 4:     Compute S⁻ when p(v) = 1 analogously
 5: Else if v has only one child
 6:     For each (Q, C, M) ∈ Find_Cands(T.left(v))
 7:         S⁺ = S⁺ ∪ {(Q, C, M)}
 8:     Compute S⁻ analogously
 9: Else if v has two children
10:     S_l⁺ = Find_Cands(T.left(v))
11:     S_r⁺ = Find_Cands(T.right(v))
12:     Set i = 1 and j = 1
13:     While i ≤ |S_l| and j ≤ |S_r|
14:         Let α_l = (Q_l, C_l, M_l) be the ith candidate in S_l
15:         Let α_l = (Q_r, C_r, M_r) be the jth candidate in S_r
16:         S⁺ = S⁺ ∪ {(min(Q_l, Q_r), C_l + C_r, M_l ∪ M_r)}
17:         If Q_l ≤ Q_r then i = i + 1
18:         If Q_r ≤ Q_l then j = j + 1
19:     Compute S⁻ analogously
20: If v is a feasible buffer location
21:     For each buffer b ∈ B
22:         If b is an inverter
23:             Find α = (Q, C, M) ∈ S⁻ such that Q_b⁺ =
                    Q − PolBufDelay(b, α) is maximized
24:         Else
25:             Find α = (Q, C, M) ∈ S⁺ such that Q_b⁺ =
                    Q − PolBufDelay(b, α) is maximized
26:         If such α exists
27:             Set M(v) = b, S_b⁺ = S_b⁺ ∪ {(Q_b⁺, C(b), M(v))}
28:         Compute S_b⁻ analogously
29:     S⁺ = S⁺ ∪ S_b⁺, S⁻ = S⁻ ∪ S_b⁻
30: Let e = (u, v) be the parent wire for v
31:     For each α = (Q, C, M) ∈ S⁺
32:         S = S ∪ {(Q − D(u, v), C + C(e), M)} − α
33:     Compute S⁻ analogously
34: Prune S⁺ and S⁻ of inferior solutions
35: Return S⁺ and S⁻.
```

The algorithm Find_Cands(v) takes input signal polarity into consideration by means of the subroutine PolBufDelay in lines 23 and 25. For CMOS and many families of buffers and inverters, due to unbalanced charging and discharging strength, the driving resistance and the intrinsic delay will be different for different polarities at the input of the buffer. The delay curves for load capacitance thus vary significantly for the two different directions of input signals for a typical inverter in the industrial buffer library. This difference is addressed by defining two pairs of input signal parameters: $R(b, r)$ and $K(b, r)$ are the resistance and the intrinsic delay when the input of the buffer b is rising, and $R(b, f)$ and $K(b, f)$ are the resistance and the intrinsic delay when the input the buffer is falling. These parameters can measured when the library is built by accurate delay evaluators. Then, for any buffer b at vertex v, the buffer delays under different input polarities are defined as $$D(v)=R(b,r)\cdot C(v)+K(b,r)\text{: input is rising}$$

$$D(v)=R(b,f)\cdot C(v)+K(b,f)\text{: input is falling}$$

where $C(v)$ is the downstream capacitance at v. There is also a small nonlinear effect on the delay curve when the load capacitance is small. In general, since in the optimization process an upper bound delay model is used to guarantee the circuit performance, $K(b, r)$ can be chosen as $$\max(0,D(0.5C(b)_{max})-R(b,r)0.5C(b)_{max}),$$

where $C(b)_{max}$ is the maximum capacitance which the buffer b can drive, and $D(C)$ is the delay of buffer with load C.

In conventional buffer insertion techniques, only one delay equation is used for each buffer type. This selection may result in degraded performance or require more buffer resources. For example, if a traditional buffer insertion equation for rising input is used for one net on a critical path, it may show a 100 ps slack improvement at the source after 10 buffers are inserted. However, worse case delay may only occur when the input is a falling signal, and use of an equation for a falling input may generate a different buffer insertion result like 12 buffers which can achieve a 200 ps slack improvement on the critical path. Conversely, for a net not on a critical path (where timing performance is not necessary), more area may be wasted by using the equation for falling input, while using the equation for rising input may result in less resources while maintaining the same performance. The present invention takes advantage of the fact that one signal is more critical and uses that signal when making the delay queries. For example, referring to FIG. 3A, if the signal 60 is rising at the sink 62, then it is falling for the inverter 64 closest to the sink and rising for the preceding inverter 65. Using this knowledge leads to an unequal spacing of inverters that can take advantage of biased pfet/nfet ratios in the design of the buffer transistors and achieve a better delay solution.

The present invention may thus compute the delay through buffers based on the input polarity. For example, suppose the polarity of the input at the source is falling, and the polarity of candidate α is negative, then the rising delay formula is used since the input of this buffer should be a rising signal. More generally, the function $PolBufDelay(b, p(s_0), α)$ is given as:

```
 1: If b is a buffer
 2:     If p(α)=0 and p(s_0)=0
 3:         return R(b, r)C(α)+K(b, r)
 4:     If p(α)=0 and p(s_0)=1
 5:         return R(b, f)C(α)+K(b, f)
 6:     If p(α)=1 and p(s_0)=0
 7:         return R(b, f)C(α)+K(b, f)
 8:     If p(α)=1 and p(s_0)=1
 9:         return R(b, r)C(α)+K(b, r)
10: Do the similar analysis for the case when b is an inverter.
```

In this function, $p(s_0)=0/1$ means rising/falling signal at the source, and $p(α)=0/1$ means positive/negative polarities of α (i.e., whether the input signal to candidate α is in phase or out of phase with the signal from the original source). The output of PolBufDelay is the delay of buffer b with load $C(α)$. This function can also be used for driver delay computation.

Returning to FIG. 3A, consideration of input signal polarity may improve delay calculations for the rising signal, but for a falling edge the extra space between inverters 62 and 64 could cause a slew violation that should be addressed. In the exemplary implementation, the present invention uses the slew metric referred to as the probability distribution function extension for ramp inputs (PERI) for the interconnect, described more fully in U.S. patent application Ser. No. 10/306,603 entitled "METHOD AND SYSTEM FOR EXTENDING DELAY AND SLEW METRICS TO RAMP INPUTS", which is hereby incorporated. PERI extends a slew metric derived for a step input into a metric for a ramp input that is valid over all input slews.

For a wire e, the slew of e is $$SL(e)=2.2\cdot R(e)[C(e)/2+C(v_j)],$$

where $C(v_j)$ is the downstream capacitance at $v_j$. The wire slew of $wp(u, v)$ is $$SL(wp(u,v)) = \Sigma_{e=(w,x)} SL(e),$$

where the sum is over all edges in the path $wp(u, v)$. For a solution $\alpha$, the slew from any buffered node $v$ (in which $M(v) \in B$) to any sink $k \in V_{s,T\alpha(v)}$ is $$SL(v,k,\alpha) = \sqrt{[SL(wp(v,k))^2 + SL(v)^2]},$$

where $SL(v)$ is the output slew of the buffer $M(v)$ inserted at node $v$. Whenever a buffer is added, the slew rate upstream is zero which means the slew downstream of a buffer is not seen by the upstream of the buffer. For a given net, since the required slew rate of every sink s and every buffer b must be satisfied, we must have $$SL(v,k,\alpha) \leq SC(k),$$

for every $k \in V_s$, $T_\alpha(v)$. Therefore, the buffer insertion problem with slew constraints can be restated with the same conditions as before of finding a candidate a for T that maximizes $Q(s_0, \alpha) \geq RAT(s_0)$ and minimizes the total buffer cost $W(s_0, \alpha)$, with the additional condition that the candidate slew rate must be less than the required slew rate.

The output slew of a buffer is traditionally computed by searching the lookup table of the buffer. It is not, however, efficient for hundreds of thousands of evaluations in state-of-the-art designs with millions of gates. In one embodiment of the present invention, output slew is computed using a novel slew metric that is simple yet efficient. The output slew of a buffer b inserted at node v is computed as $$SL(v) = RS(b) \cdot C(v) + KS(b),$$

where $C(v)$ is the downstream capacitance at v, $RS(b)$ is the slew resistance of buffer b, and $KS(b)$ is the intrinsic slew of buffer b. The slew resistance of a buffer is defined in the illustrative embodiment as the ratio of the change of its output slew to the change of its load capacitance when the load capacitance changes from 30% of its maximum load capacitance to 70% of its maximum load capacitance, and the intrinsic slew is defined as the output slew value of the buffer when buffer does not drive any load. The foregoing formula for buffer output slew is derived by observation that there is a linear effect of slew in terms of load capacitance, which has been verified with extensive simulations on different buffers.

Although the slew resistance and the intrinsic slew of a buffer are also dependent on the input signal polarities, the present invention adopts a conservative approach on the slew constraints and always chooses the worst slew resistance and intrinsic slew between the two cases, as illustrated in FIG. 3B. A seen in that figure, both the rising and the falling signals 66 and 68 are being considered at each step. This approach means that the algorithm minimizes the worst delay in either case which would invariably cause inverters to be equally spaced on the line. Thus, if the line is optimized for the rising signal coming out of the source as in FIG. 3A then a falling signal would be propagate slower than in the design of FIG. 3B, but this behavior is acceptable because the rising signal was predetermined to be more critical.

The output slew is also dependent on the input slew of the buffer. A fixed input slew value may be used, such as 200 ps for every buffer. When inserting a buffer in a bottom-up algorithm, the topology of the tree upstream from the buffer is still unknown. Since one thus cannot know the input slew value of the buffer, the exemplary implementation relies on a fixed value. The value of 200 ps represents a typical slew found on a well-optimized path.

In some state-of-the-art designs, due to the existence of routing and physical obstacles, the locations of buffers can be very limited, especially if there are thousands of buffer trees. It is therefore possible that there will be no feasible solution to satisfy the slew constraints, i.e., the length of the placement blockage in which no buffer can be inserted is greater than the length corresponding to the slew constraints. In such cases, the buffer insertion tool of the present invention still proceeds to find the best solution even if it is impossible to immediately fix the slew violation. For example, a two-pin net with slew constraints of 800 ns may have a blockage exiting on the path of the net, and even if two buffers are inserted at both sides of the blockage the slew is still 900 ns. Nevertheless, the buffered candidate solution is still preferable since the solution with no buffers inserted may yield a 1,600 ns slew. For later design stages, it may be easier to fix the slew based on the solution with 900 ns. An existing slew recovery process can be utilized to recover solutions to handle such cases when no otherwise feasible solutions exist. If a buffer position is encountered and all new candidates with all possible types of buffers inserted at this position cannot meet the given slew constraints (which means all new candidates are pruned based on the slew condition), the tool will regenerate these new candidates assuming no slew constraint. All solutions can then be flagged and after they are propagated to the source, the solution with best slack and reasonable slew is selected.

However, this traditional slew recovery does not work well in certain circumstances where candidates with very big slew, such as the solution with zero buffers or one buffer inserted, may prune other candidates with the slew close to the constraints in terms of slack in the later bottom-up process. It is because all new candidates are "recovered" and all previous candidates are still kept, and the best timing results are still desired on critical or near-critical nets. As the result, the final selected solution may have an unacceptable slew value.

To generate a better slew-slack trade off curve, the present invention preferably uses a new slew recovery technique. Whenever a slew recovery is called, there is always a big blockage after the current buffer position in the bottom-up process. To achieve better slew results, all partial candidates at the current stage are required to have at least one buffer inserted after this blockage. This insertion can be simply implemented by deleting all solutions with minimum buffer numbers whenever a slew recovery is called, i.e., the solution with zero buffers inserted is deleted in the first slew recovery call, the solutions with one buffer inserted are deleted in the second slew recovery call, and the solutions with ith buffer inserted are deleted in the i+1th slew recovery call.

Figure 4:
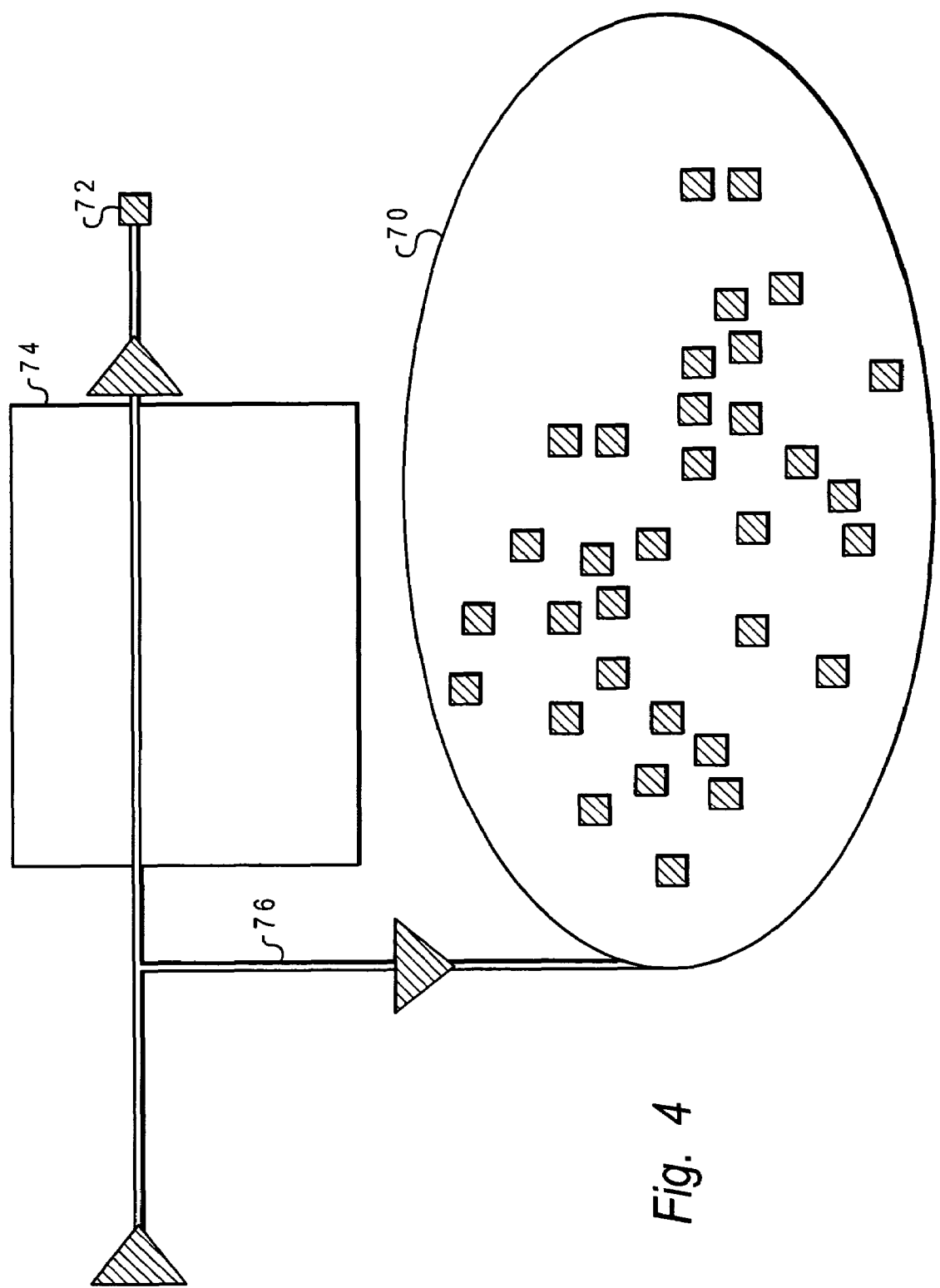
FIG. 4 is a diagram illustrating an example of a blockage in a net creating a slew violation, as part of the slew recovery that may be performed in accordance with one implementation of the present invention.

Slew recovery may be further understood with reference to FIG. 4 which illustrates an example of a net having most of the sinks 70 clustered together at the bottom of the figure, with one sink 72 at the upper right. The path to sink 72 traverses a large blockage 74. Because of the size of blockage 74, it may be impossible to fix a slew violation for this sink. When running a van Ginneken-style algorithm, solutions will be successively thrown out when they fail to meet the constraints, and once the algorithm proceeds to the location preceding blockage 74 (i.e., just to the left of blockage 74 in FIG. 4) no candidates will remain. If such a process is followed by merging at the Steiner point, no candidates will be propagated to the source, and buffer insertion will accomplish nothing. The present invention avoids this problem by temporarily relaxing the slew constraints and allowing candidates that violate the slew constraints to exist for one candidate insertion point only. So in FIG. 4, the path just before blockage 74 will now have candidates even though they violate the slew constraint. In this manner, when the merging at the Steiner point takes place, the solutions for the other branch 76 will be propagated, so that all slew violations will be fixed except for the one traversing blockage 74. That violation can be addressed later, such as by relocating the sink.

These slew considerations can be implemented in the candidate selection algorithm by adding two fields SL, SC to each candidate to represent its current wire slew and its tightest required slew among all sinks in the maximum subtree of this candidate. Then, besides the traditional suboptimal definition, a candidate $\alpha$ is pruned if $SL(\alpha) > SC(\alpha)$. This enhanced algorithm Find_Cands_Slew is thus given as:

```
1: S⁺ = S⁻ = S_b⁺ = S_b⁻ = ∅
2: If v ∈ V_s and p(v) = 0
3:     S⁺ = {(RAT(v), C(v), b~, 0, SC(v)}
4:     Compute S⁻ when p(v) = 1 analogously
5: Else if v has only one child
6:     For each (Q, C, M, SL, SC) ∈ Find_Cands(T.left(v))
7:         S⁺ = S⁺ ∪ {(Q, C, M, SL, SC)}
8:     Compute S⁻ analogously
9: Else if v has two children
10:    S_l⁺ = Find_Cands(T.left(v))
11:    S_r⁺ = Find_Cands(T.right(v))
12:    Set i = 1 and j = 1
13:    While i ≤ |S_l| and j ≤ |S_r|
14:        Let α_1 = (Q_l, C_l, M_l, SL_l, SC_l) be the ith candidate in S_l
15:        Let α_1 = (Q_r, C_r, M_r, SL_r, SC_r) be the jth candidate in S_r
16:        S⁺ = S⁺ ∪ {(min(Q_l, Q_r), C_l + C_r, M_l ∪ M_r), max(SL_l + SL_r),
                    min(SC_l, SC_r)}
17:        If Q_l ≤ Q_r then i = i + 1
18:        If Q_r ≤ Q_l then j = j + 1
19:    Compute S⁻ analogously
20: If v is a feasible buffer location
21:    For each buffer b ∈ B
22:        If b is an inverter
23:            Find α = (Q, C, M, SL, SC) ∈ S⁻ such that Q_b⁺ = Q −
                PolBufDelay(b, p(s_0), α) is maximized
                and SL(v, k, α) ≤ SC(k)
24:        Else
25:            Find α = (Q, C, M, SL, SC) ∈ S⁺ such that Q_b⁺ = Q −
                PolBufDelay(b, p(s_0), α) is maximized
                and SL(v, k, α) ≤ SC(k)
26:        If such α exists
27:            Set M(v) = b, S_b⁺ = S_b⁺ ∪ {(Q_b⁺, C(b), M(v), 0, SC(b))}
28:        Compute S_b⁻ analogously
29:    If S_b⁺ and S_b⁻ are both empty // Slew Recovery
30:        Find |M_s| = min_{α∈S+∪S−}{|M| such that α = (Q, C,M, SL, SC)}
31:        Delete every candidate α with |M| = |M_s| in S⁺ and S⁻
32:        Repeat steps 22 to 29 but condition SL(v, k, α) ≤ SC(k)
                is not required
33:    S⁺ = S⁺ ∪ S_b⁺, S⁻ = S⁻ ∪ S_b⁻
34: Let e = (u, v) be the parent wire for v
35: For each α = (Q, C, M, SL, SC) ∈ S⁺
36:    S = S ∪ {(Q − D(u, v), C + C(e), M, SL + SL(e), SC)} − α
37: Compute S⁻ analogously
38: Prune S⁺ and S⁻ of inferior solutions and also prune any
       candidate α such that SL(α) > SC(α)
39: Return S⁺ and S⁻.
```

Simulation results for several industrial designs with 300,000+ objects show that consideration of timing parameters in buffer insertion as taught by the present invention can significantly speed up the process while yielding competitive quality results.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the invention has been described in the context of the van Ginneken algorithm, it could be implemented in other algorithms as well. It is therefore contemplated that such modifications can be made without departing from the spirit or scope of the present invention as defined in the appended claims.

What is claimed is:

1. A computer system comprising:

one or more processors which process program instructions;

a memory device connected to said one or more processors; and program instructions residing in said memory device for determining buffer insertion locations in a net of an integrated circuit design by defining at least one signal slew constraint for the net, establishing a plurality of candidate locations for inserting one or more buffers into the net, and selecting buffer insertion locations from among the candidate locations by pruning any candidate location whose buffer output slew is greater than the signal slew constraint, the buffer output slew $SL(v)$ of a given candidate location having a buffer b inserted at a node v being computed as $$SL(v) = RS(b) \cdot C(v) + KS(b)$$

wherein $C(v)$ is the downstream capacitance at v, $RS(b)$ is the slew resistance of buffer b, and $KS(b)$ is the intrinsic slew of buffer b.

2. The computer system of claim 1 wherein the selecting of the buffer insertion locations includes optimizing slack and buffer cost.

3. The computer system of claim 1 wherein the selecting of the buffer insertion locations includes computing delay through a given buffer based on an input signal polarity.

4. The computer system of claim 3 wherein the selecting of the buffer insertion locations further includes computing delay through the given buffer based on the polarity of a corresponding candidate location.

5. The computer system of claim 4 wherein the selecting of the buffer insertion locations uses worst-case slew resistance and intrinsic slew in considering the slew constraint.

6. The computer system of claim 1 wherein said program instructions further find a partial solution to the slew constraint when the selecting of the buffer insertion locations selects no locations due to slew violations.

7. A computer program product comprising:

a computer-readable medium; and program instructions residing in said medium for determining buffer insertion locations in a net of an integrated circuit design by defining at least one signal slew constraint for the net, establishing a plurality of candidate locations for inserting one or more buffers into the net, and selecting buffer insertion locations from among the candidate locations by pruning any candidate location whose buffer output slew is greater than the signal slew constraint, the buffer output slew $SL(v)$ of a given candidate location having a buffer b inserted at a node v being computed as $$SL(v) = RS(b) \cdot C(v) + KS(b)$$

wherein $C(v)$ is the downstream capacitance at v, $RS(b)$ is the slew resistance of buffer b, and $KS(b)$ is the intrinsic slew of buffer b.

8. The computer program product of claim 5 wherein the selecting of the buffer insertion locations includes optimizing slack and buffer cost.

9. The computer program product of claim 7 wherein the selecting of the buffer insertion locations includes computing delay through a given buffer based on an input signal polarity.

10. The computer program product of claim 9 wherein the selecting of the buffer insertion locations further includes computing delay through the given buffer based on the polarity of a corresponding candidate location.

11. The computer program product of claim 10 wherein the selecting of the buffer insertion locations uses worst-case slew resistance and intrinsic slew in considering the slew constraint.

12. The computer program product of claim 7 wherein said program instructions further find a partial solution to the slew constraint when the selecting of the buffer insertion locations selects no locations due to slew violations.

* * * * *